United States Patent
Moeneclaey et al.

(10) Patent No.: US 12,028,639 B2
(45) Date of Patent: Jul. 2, 2024

(54) PHOTOSENSITIVE DEVICE INCLUDING AN INTEGRATOR CIRCUIT PER GROUP OF AT LEAST TWO PHOTOSENSITIVE ELEMENTS

(71) Applicants: STMicroelectronics (Alps) SAS, Grenoble (FR); STMicroelectronics (Grenoble 2) SAS, Grenoble (FR)

(72) Inventors: Nicolas Moeneclaey, Vourey (FR); Samuel Foulon, Grenoble (FR)

(73) Assignees: STMicroelectronics (Alps) SAS, Grenoble (FR); STMicroelectronics (Grenoble 2) SAS, Grenoble (FR)

( * ) Notice: Subject to any disclaimer, the term of this patent is extended or adjusted under 35 U.S.C. 154(b) by 219 days.

(21) Appl. No.: 17/649,858

(22) Filed: Feb. 3, 2022

(65) Prior Publication Data

US 2022/0295007 A1 Sep. 15, 2022

(30) Foreign Application Priority Data

Mar. 9, 2021 (FR) ...................................... 2102275

(51) Int. Cl.
*H04N 25/778* (2023.01)
*G01J 1/42* (2006.01)
*G01J 1/44* (2006.01)
*H04N 25/772* (2023.01)

(52) U.S. Cl.
CPC .......... *H04N 25/778* (2023.01); *G01J 1/4204* (2013.01); *G01J 1/44* (2013.01); *H04N 25/772* (2023.01)

(58) Field of Classification Search
CPC ... H04N 25/778; H04N 25/772; G01J 1/4204; G01J 1/44; H03F 2203/45332; H03F 2203/45546; H03F 2203/45632; H03F 1/086; H03F 3/082; H03F 3/087; H03F 2203/45512; H03F 3/45183;
(Continued)

(56) References Cited

U.S. PATENT DOCUMENTS

2002/0109075 A1* 8/2002 Ono .................. H03F 3/087
                                                    327/307
2004/0128006 A1* 7/2004 Jahnicke ............. G06F 1/04
                                                    700/86
(Continued)

FOREIGN PATENT DOCUMENTS

WO WO-2011022232 A1 * 2/2011 ............. G06G 7/186

*Primary Examiner* — Michael Lee
(74) *Attorney, Agent, or Firm* — Slater Matsil, LLP

(57) ABSTRACT

A photosensitive device includes a peripheral circuit semiconductor region, a photosensitive circuit semiconductor region including at least one group of at least two photosensitive elements configured to generate a photoelectric signal on a node called critical node. The device further includes an integrator circuit per group of photosensitive elements, each including: a differential circuit for each photosensitive element of the group, in the photosensitive circuit semiconductor region, an amplification circuit, in the peripheral circuit semiconductor region, and a feedback circuit for each photosensitive element of the group, comprising a capacitive element located in the photosensitive circuit semiconductor region coupled between the output node of the amplification circuit and the respective critical node.

20 Claims, 3 Drawing Sheets

(58) Field of Classification Search
CPC .......... H03F 3/45475; H03F 2200/264; H03F 2203/45174; H03F 3/70
See application file for complete search history.

(56) References Cited

U.S. PATENT DOCUMENTS

| | | | |
|---|---|---|---|
| 2005/0275466 A1* | 12/2005 | Dasgupta | H03F 3/08 330/308 |
| 2006/0165294 A1 | 7/2006 | Mizuno et al. | |
| 2011/0043270 A1* | 2/2011 | Kusuda | G06G 7/186 327/337 |
| 2012/0049047 A1 | 3/2012 | Yin et al. | |
| 2013/0214125 A1* | 8/2013 | Solhusvik | H04N 23/71 250/208.1 |
| 2014/0027606 A1* | 1/2014 | Raynor | G06F 3/017 250/208.1 |
| 2018/0176493 A1 | 6/2018 | Spivak et al. | |

\* cited by examiner

PHOTOSENSITIVE DEVICE INCLUDING AN INTEGRATOR CIRCUIT PER GROUP OF AT LEAST TWO PHOTOSENSITIVE ELEMENTS

CROSS-REFERENCE TO RELATED APPLICATIONS

This application claims priority to French Patent Application No. 2102275, filed on Mar. 9, 2021, which application is hereby incorporated by reference herein in its entirety.

TECHNICAL FIELD

The present disclosure generally relates to photosensitive devices and, in particular embodiments, to sensors intended for measuring ambient light, usually designated as "ALS" for "Ambient Light Sensing."

BACKGROUND

ALS-type photosensitive devices conventionally include photosensitive elements dedicated to measuring a respective optical component of the ambient light. A read circuit is provided for converting the signal photogenerated by each photosensitive element into a useful format (e.g., a digital value).

The analog signal photogenerated by the photosensitive elements is a quantity sensitive to electrical noise. Consequently, the read circuits are typically made in the immediate proximity of the photosensitive elements to avoid degradation of the measurement accuracy due to resistive noise from transmission lines and switching circuits.

Read circuits typically include an amplifier and an analog-to-digital converter, which are relatively bulky.

Typically, a photosensitive element is dedicated to the red component, a photosensitive element is dedicated to the green component, and a photosensitive element is dedicated to the blue component of light. Many components can be provided, such as ultraviolet components, other specific colors of the visible, infrared components, or other extended-spectrum components (e.g., white light), with a photosensitive element respectively dedicated to each.

The photosensitive elements are typically arranged in a detection matrix, which can have a large surface size—to the point that an optical signal poorly distributed in space (e.g., in the case of a point of light) can irradiate the photosensitive elements of part of the matrix but not other photosensitive elements of another part of the matrix.

Consequently, some photosensitive elements may not be illuminated by the optical signal to be detected, which may cause an error in detecting the components corresponding to these photosensitive elements.

The position of the sensor in, for example, an orientation in portrait mode or landscape mode can also introduce variations in the detected components.

It has been proposed to multiply the number of photosensitive elements dedicated to the same component and distribute them in the matrix to avoid these disadvantages of spatial sensitivity. However, conventional techniques for multiplying the number of photosensitive elements dedicated to the same component introduce a concomitant multiplication of the number of read circuits provided for each photosensitive element, increasing space requirement and manufacturing costs.

Thus, there is a need to provide photosensitive sensors with low spatial sensitivity in compact, inexpensive, and efficient embodiments, particularly having measurement precision.

SUMMARY

According to one aspect, a photosensitive device is provided having a peripheral circuit semiconductor region and a photosensitive circuit semiconductor region including at least one group of at least two photosensitive elements configured to generate a photoelectric signal on a node called a critical node. According to a general feature of this aspect, the device further includes an integrator circuit per group of photosensitive elements, each integrator circuit including an amplification circuit, located in the peripheral circuit semiconductor region and comprising input nodes and an output node; a differential circuit for each photosensitive element of the group, located in the photosensitive circuit semiconductor region and coupled between the respective critical node and the input nodes of the amplification circuit; and a feedback circuit for each photosensitive element of the group, comprising a capacitive element located in the photosensitive circuit semiconductor region and connected between the output node of the amplification circuit and the respective critical node.

In embodiments, the differential circuit is configured to generate a differential signal representative of the photoelectric signal generated on the critical node of the respective photosensitive element.

In embodiments, the amplification circuit is configured to generate on an output node an output signal representative of the sum of the differential signals of the respective group.

In embodiments, the amplification circuit is shared for the photosensitive elements belonging to the same group. The shared amplification circuits are not produced in the proximity of the critical nodes of each photosensitive element of the group, but are produced in the peripheral circuit semiconductor region.

To avoid loss of precision due to electronic noise, the differential circuits, which are typically not bulky, and the capacitive elements of the feedback circuits, are made in the photosensitive circuit semiconductor region in the proximity of the critical nodes of the photosensitive elements. The differential circuits and the capacitive elements coupled to the output of the amplification circuit ensure a high impedance on the signals exchanged with the critical nodes.

Thus, it is possible to multiply the number of photosensitive elements without losing precision and with no additional increase in size or manufacturing costs.

According to one embodiment, each differential circuit includes a differential pair of transistors whose conduction terminals are coupled in parallel between a supply current source and respectively two differential channels, and whose control terminals are respectively coupled to a reference voltage terminal and to the critical node of the respective photosensitive element.

The differential signals generated in the photosensitive circuit semiconductor region by the differential circuits enable the photogenerated measurement to be communicated with precision. Since the differential signal is a little sensitive to noise, the differential circuits and the respective amplification circuit can be separated by a significant distance without losing precision.

According to one embodiment, the photosensitive elements of each group are spatially distributed in the photosensitive circuit semiconductor region to be distributed in a substantially homogeneous manner in the area occupied by the photosensitive elements.

This is particularly advantageous for limiting the spatial sensitivity of the photosensitive device.

In embodiments, the spatial distribution of the photosensitive elements is defined by a central symmetry on the point of symmetry located substantially at the center of the area occupied by the photosensitive elements.

In embodiments, the photosensitive elements are spatially distributed such that for a number n of photosensitive elements per group, one photosensitive element of each group is present in each subdivision into n equal surfaces of the area occupied by the photosensitive elements.

In an embodiment, the peripheral circuit semiconductor region further includes, for each amplification circuit, an analog-to-digital converter configured to convert the respective output signal into a digital signal.

Again, only one analog-to-digital converter is provided regardless of the number of photosensitive elements in each group, advantageously in terms of space requirement and cost.

According to another aspect, provision is made of an ambient light sensor comprising a photosensitive device as defined above, wherein the photosensitive elements of each group are dedicated to the measurement of a respective optical component of the ambient light.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
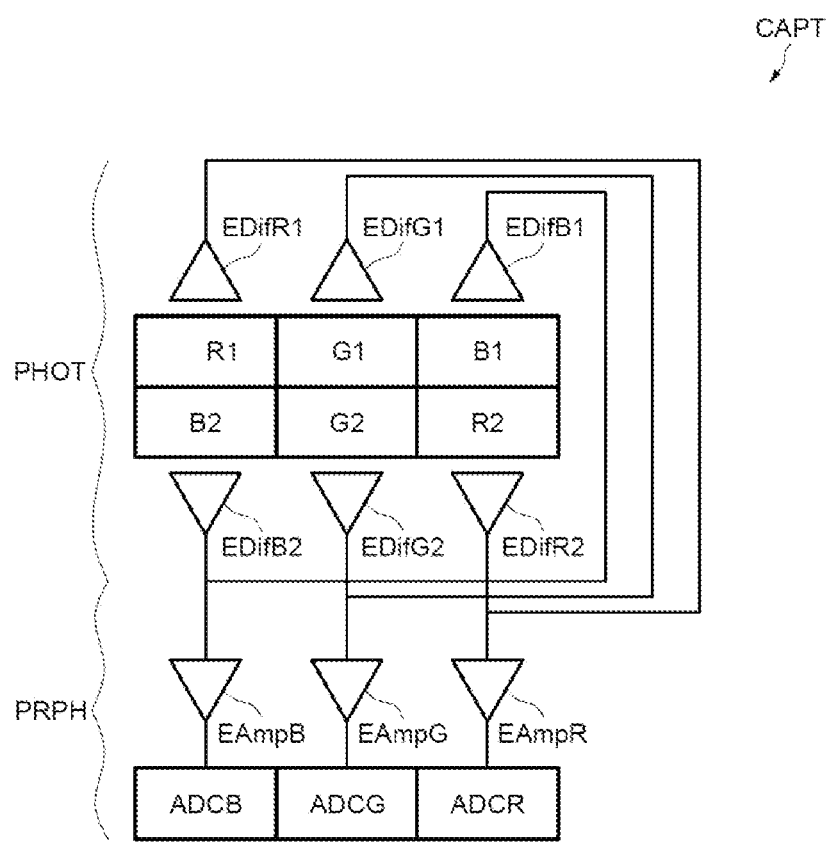
FIG. 1 is a diagram of an embodiment of a photosensitive device.

FIG. 1 illustrates an exemplary embodiment of a photosensitive device integrated in, for example, an ambient light sensor of the Ambient Light Sensing (ALS) type having groups of several photosensitive elements R1-R2, G1-G2, B1-B2. The photosensitive elements R1, R2, G1, G2, B1, B2 are made in a photosensitive circuit semiconductor region PHOT, while read elements are made, at least in part, in a peripheral circuit semiconductor region PRPH.

In an embodiment, the sensor CAPT includes three groups of two photosensitive elements, the photosensitive elements R1, R2 of one group being intended for measuring a red component of the ambient light, the photosensitive elements G1, G2 of another group being intended for measuring a green component of the ambient light, and the photosensitive elements B1, B2 of the last group being intended for measuring a blue component of the ambient light.

The photosensitive elements are typically provided with respective optical filters in this regard.

In embodiments, other photosensitive elements for measuring other components of the visible spectrum in non-primary colors and components outside the visible spectrum (e.g., infrared or ultraviolet components) may be included.

In embodiments, the photosensitive elements of each group R1-R2, G1-G2, B1-B2 are spatially distributed to be positioned in a substantially homogeneous distribution of the area occupied by the photosensitive elements of the photosensitive circuit semiconductor region PHOT.

In embodiments, the spatial distribution can be in accordance with a central symmetry of the photosensitive elements of the same group, on the point of symmetry located substantially in the center of the area occupied by the photosensitive elements.

In embodiments, one photosensitive element of each group is present in the two horizontal halves in the orientation of FIG. 1, that is to say, the upper half includes the photosensitive elements R1, G1, B1, while the lower half includes the photosensitive elements B2, G2, R2.

In embodiments, a photosensitive element of each group is (also) present in the two vertical halves in the orientation of FIG. 1, that is to say, the photosensitive element R1, B2 as well as two photosensitive half-elements G1, G2 in the left half, and the photosensitive elements R2, B1 as well as two photosensitive half-elements G1, G2 in the right half.

Such a distribution of the photosensitive elements of the photosensitive sensor reduces the spatial sensitivity of the ALS-type measurement.

In embodiments, for a number "n" of photosensitive elements in each group, the spatial distribution of the photosensitive elements (PD1-PDn) of each group is advantageously made so that one photosensitive element of each group is present in each subdivision of a division into n equal surfaces of the surface of the photosensitive circuit region PHOT.

For example, for three groups of three photosensitive elements (Ri, Gi, Bi, with i=1 . . . n, and n=3), then provision can be made of distribution in three rows and three columns of photosensitive elements so that one photosensitive element of each group is present in each row and one photosensitive element of each group is present in each column (e.g., for the following rows: R1 G1 B1; B2 R2 G2; G3 B3 R3).

Moreover, the photosensitive sensor CAPT further includes an integrator circuit per group of photosensitive elements.

Each integrator circuit includes, on the one hand, a differential circuit EDifR1, EDifR2, EDifG1, EDifG2, EDifB1, EDifB2, for each photosensitive element R1, R2, G1, G2, B1, B2, produced in the photosensitive circuit semiconductor region PHOT.

The differential circuits are configured to generate a differential signal, representative of a photoelectric signal generated on a node called critical node by the respective photosensitive elements.

Each integrator circuit includes, on the one hand, an amplification circuit EAmpR, EAmpG, EAmpB shared for the different photosensitive elements of each group, produced in the peripheral circuit semiconductor region PRPH.

The amplification circuits EAmpR, EAmpG, and EAmpB are configured to generate an output signal representative of the integration of the sum of the differential signals from the different differential circuits of each group. Analog-to-digital converters ADCR, ADCG, and ADCB are further provided at the output of each amplification circuit EAmpR, EAmpG, and EAmpB to convert the analog output signal into a digital read datum.

The integrator circuits are configured to integrate the generations of the photoelectric signals by the groups of photosensitive elements, typically during an exposure period during which the photosensitive elements are illuminated by the measured optical signal.

Each integrator circuit includes in this regard a capacitive feedback circuit (not shown in FIG. 1) for each photosensitive element of the respective group R1-R2, G1-G2, B1-B2. The feedback circuits each comprise a capacitive element made in the photosensitive circuit semiconductor region PHOT and connected between the output node of the amplification circuit EAmpR, EAmpG, and EAmpB and the respective critical node.

Figure 2:
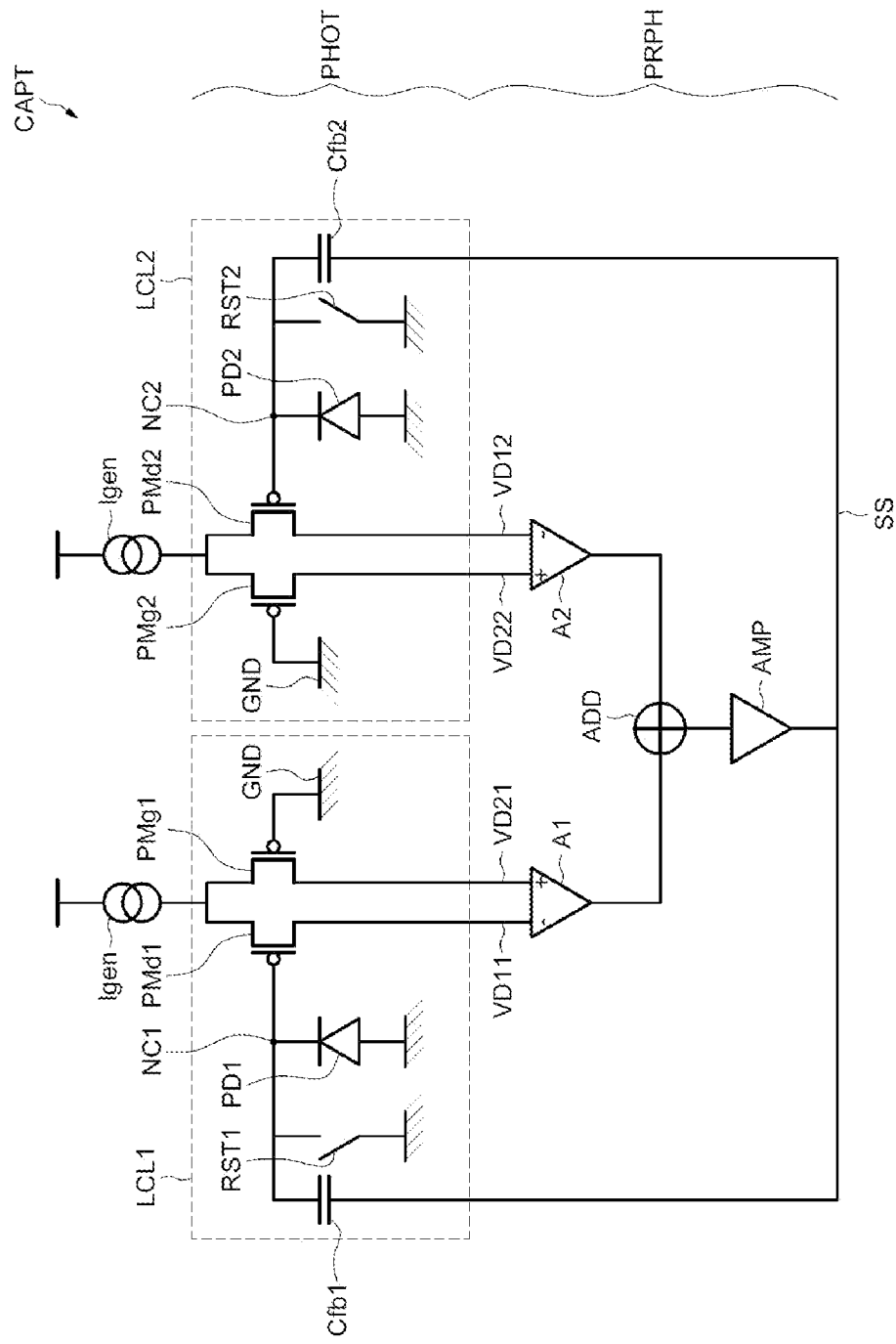
FIG. 2 is a diagram of an integrator circuit of a group of two photosensitive elements of a photosensitive device.

FIG. 2 illustrates an exemplary embodiment of the integrator circuit of a group of two photosensitive elements PD1, PD2 of a photosensitive device CAPT such as that described above in relation to FIG. 1.

The integrator circuits relating to both of the photosensitive elements PD1, PD2, described below, being perfectly symmetrical (that is to say identical for each respective photosensitive element PD1, PD2), the following description is made for a single circuit but is valid for both circuits. The references of the circuit elements relating to the photosensitive element PD1 end with "1", while the references of the circuit elements relating to the photosensitive element PD2 end with "2".

Each photosensitive element is a typical embodiment of photodiode PD1, PD2, possibly a pinched photodiode, adapted to generate electrical charges on a node called critical node NC1, NC2 when it is irradiated by an optical signal.

The anode of the photodiode PD1, PD2 is coupled to ground GND, and the cathode is coupled to the critical node NC1, NC2.

The differential circuit EDif1, EDif2 includes a differential pair of P-type Metal Oxide Semiconductor (PMOS) transistors coupled in parallel on their conduction terminals, that is to say, their sources and drains.

Each differential pair is produced in the local vicinity LCL1, LCL2 of the respective photodiode PD1, PD2, in the photosensitive circuit semiconductor region PHOT.

The critical node NC1, NC2 of each photosensitive element PD1, PD2 is directly coupled to the control electrode (i.e., the gate) of one of the two transistors PMd1, PMd2 of the differential pair.

The other transistor PMg1, PMg2 of the differential pair is controlled by a ground reference voltage GND as a "reference" of the differential signal.

The two transistors PMd1-PMg1, PMd2-PMg2 of the differential pair are power supplied by a reference current source Igen on their sources.

Thus, each differential circuit EDfi1, EDif2 is configured to generate a differential signal representative of the photoelectric signal generated on the respective critical node NC1, NC2, in the form of complementary currents flowing on two differential channels VD11-VD21, VD21-VD22 coupled to the drains of the PMOS transistors.

The differential paths are connected, outside the local vicinity of the photosensitive elements LCL1, LCL2 and outside the photosensitive circuit semiconductor region PHOT, to inputs of the amplification circuit EAmp common to the photosensitive elements of this group, produced in the peripheral circuit semiconductor region PRPH.

In this example, the amplification circuit EAmp comprises a preamplifier A1, A2 for each differential circuit EDif1, EDif2. A negative input (−) of the preamplifier A1, A2 is coupled to the differential path VD11, VD12 connected to the drain of the transistor PMd1, which is controlled by the voltage present on the critical node NC1, NC2.

A positive input (+) of the preamplifier A1, A2 is coupled to the differential path VD21, VD22 connected to the drain of the transistor PMg1, which is controlled by the ground reference voltage GND.

The outputs of the two preamplifiers A1, A2 are added by an adder circuit ADD, then amplified by an amplifier AMP.

The output of the amplifier AMP constitutes the output of the amplification circuit EAmp. It thus provides an output signal SS representative of the integration of the sum of the differential signals of the group.

Given that the photosensitive elements PD1, PD2 of the same group are dedicated to measuring the same component of the ambient optical signal, the output signal SS provides the total value of this component measured by the sensor CAPT.

This output signal can be converted into a digital datum by an analog-to-digital converter as described previously in relation to FIG. 1.

Finally, for said integration of the photoelectric signals generated by the photodiodes PD1, PD2 during an exposure period, the integrator circuit includes a capacitive feedback circuit between the output SS of the amplification circuit EAmp and the critical node CN1, CN2.

A capacitive element Cfb1, Cfb2 is produced in the photosensitive circuit semiconductor region PHOT, in the local vicinity LCL1, LCL2 of the photodiode PD1, PD2.

The capacitive element Cfb1, Cfb2, therefore, allows to accumulate the photogenerated charges on the critical node NC1, NC2 and to supply the voltage signal controlling the transistor PMd1, PMd2 of the differential circuit EDif1, EDif2.

Moreover, a switching element RST1, RST2 is coupled between the critical node NC1, NC2, and the ground GND, to reset the potential on the critical node NC1, NC2 and to empty the charge of the capacitive element Cfb1, Cfb2, to start an exposure phase in a reset state, that is to say, neutral and known.

During the integration of the exposure period, the output signal SS feeds back in a distributed manner in the two capacitive elements Cfb1, Cfb2 of the two critical nodes NC1, NC2, the voltages of which are reflected on the negative inputs (−) of the amplification circuit EAmp.

A conventional integrator circuit—including only a capacitive feedback circuit on the negative input of an amplifier—balances by equalizing the voltage on the negative input with the voltage on the positive input.

In the configuration described in relation to FIG. 2, the integrator circuit is balanced when the average of the voltages on the two negative inputs (−) of the preamplifiers A1, A2 equalizes the average of the voltages on the two positive inputs (+) of the preamplifiers A1, A2.

Using the differential circuits EDif1, EDif2, the balance is obtained when the average of the voltages on the critical nodes NC1, NC2 is zero (strictly speaking, the balance is obtained when the average of the voltages on the critical nodes NC1, NC2 is equal to the average of the voltages controlling the "reference" transistors PMg1, PMg2 of each differential pair, that is to say at the ground reference voltage GND).

Generally, an amount of charges generated by only one of the two photodiodes PD1, PD2 (e.g., in the case of an inhomogeneous light signal between the two photodiodes), has the same effect in the integrator circuit as if each of the two photodiodes PD1, PD2 independently generated half of this amount of charges.

In the event of such an imbalance in the generation of the charges by the two photodiodes PD1, PD2, the respective voltages of the two critical nodes can diverge by the mechanism of the distributed feedback.

However, in practice, the divergence remains contained at perfectly acceptable amplitudes because the capacitive value provided for the capacitive feedback element Cfb1, Cfb2 is much lower than the equivalent capacitive value of the photodiodes PD1, PD2.

In embodiments, the capacitive value of the capacitive feedback elements Cfb1, Cfb2 is of the order of 20 fF (femto-Farad), while the equivalent capacitive value of the photodiodes PD1, PD2 is of the order of 5 pF (pico-Farad).

An example of a recommendation to limit the divergence of the voltages of the critical nodes NC1, NC2 would be to take care to maintain a ratio of the equivalent capacitive value of the photodiodes "Cpd" to the capacitive feedback value "Cfb," "Cpd/Cfb" of at least 10.

The "Cpd/Cfb" ratio can vary according to the desired performance, it being possible in particular to be larger for better precision or smaller for greater gain.

Figure 3:
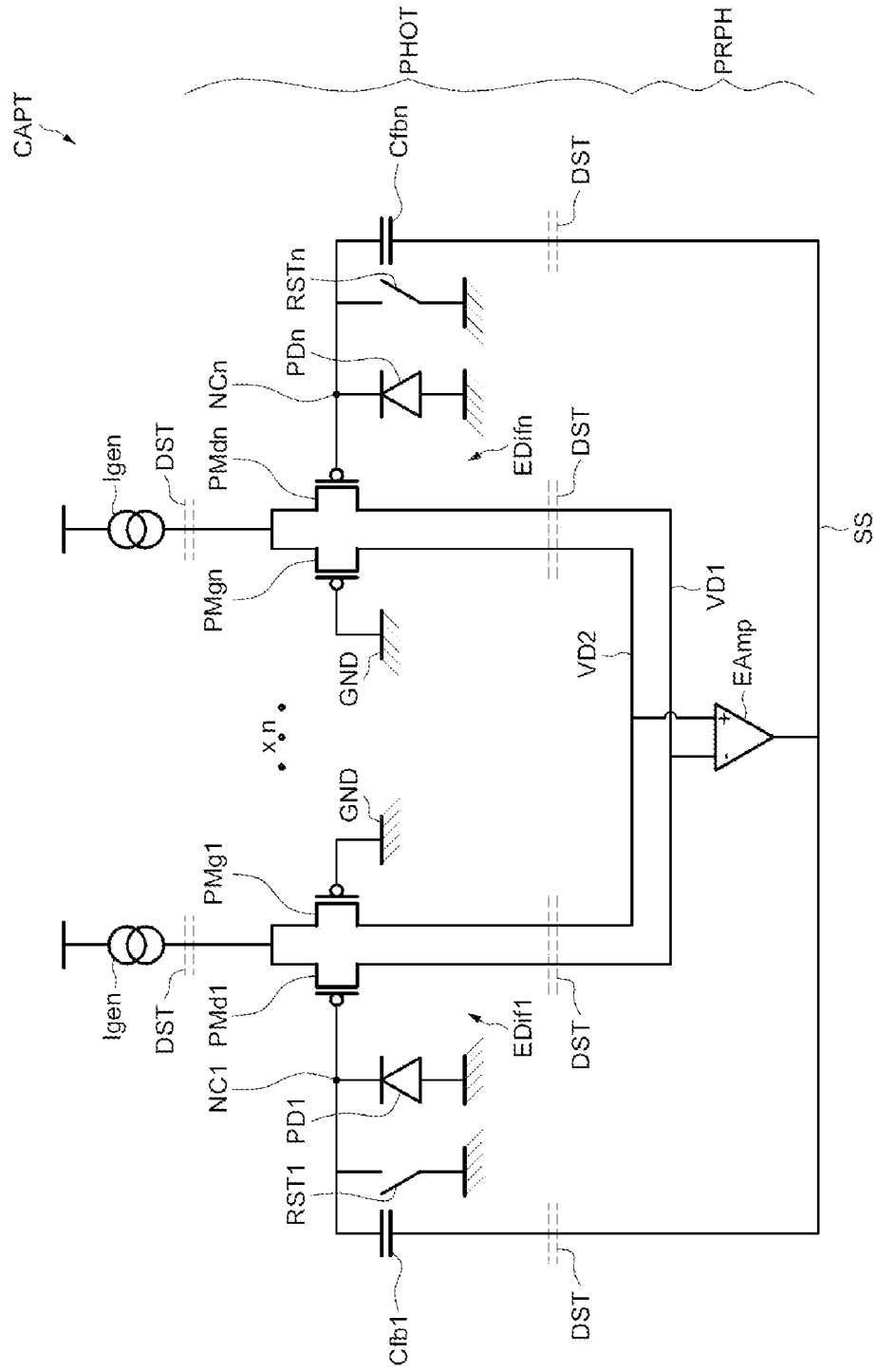
FIG. 3 is a diagram of an integrator circuit of a group of "n" photosensitive elements of a sensor.

FIG. 3 illustrates another exemplary embodiment of the integrator circuit of a group of "n" photosensitive elements PD1, . . . , PDn of a sensor CAPT such as that described above in relation to FIG. 1.

The number "n" of photosensitive elements in the group is greater than or equal to 2, for example, so that each group of photosensitive elements includes three or four photosensitive elements.

The common elements described in relation to FIG. 2 bear the same references, and will not be detailed again here. In particular, the description of the common elements and the references relating thereto in FIG. 2 corresponds to the case where n=2 in FIG. 3.

Nevertheless, this example illustrates, in particular, an advantageous embodiment of the coupling of the differential channels VD1, VD2 of the differential circuits EDif1, EDifn, directly coupled to each other on the negative input (−) and, respectively, the positive input (+) of the amplification circuit EAmp.

Indeed, in this example, the preamplifiers A1, A2 (FIG. 2) as well as the adder circuit ADD (FIG. 2) are not shown distinctly. The summation of the n differential signals of the group is obtained by effect of the Kirchhoff's law of nodes.

The currents carrying the differential signal of each of the n photosensitive elements PD1-PDn are thus added on the negative (−) and positive (+) input nodes of the amplification circuit EAmp.

The drains of the transistors PMd1-PMdn controlled by the photoelectric signal generated on the critical nodes NC1-NCn are coupled to the same differential path VD1 connected to the negative input node (−) of the amplification circuit EAmp; while the drains of the transistors PMg1-PMgn controlled by the reference voltage GND are coupled to the same differential path VD2 connected to the positive input node (+) of the amplification circuit EAmp.

Since the output impedance of the differential circuits EDif1-EDifn is relatively large, the differential signals are little sensitive to parasitic signals, in particular to parasitic resistive values of transmission lines.

Thus the distance DST separating the differential circuits EDif1-EDifn from the amplification circuit EAmp can be increased without introducing losses in the precision of the measured signal.

Likewise, the output impedance of the amplification circuit EAmp as well as the output impedance of the current generators Igen, being typically large, the distance DST separating the differential circuits EDif1-EDifn from the current generators Igen and the distance DST separating the capacitive elements Cfb1-Cfbn from the output of the amplification circuit EAmp, can be increased without introducing harmful parasitic variations in the signals respectively conveyed.

In summary, an advantageous design for spatial separation of integrator circuits has been described, wherein the differential circuits EDif1-EDifn and the capacitive feedback elements Cfb1-Cfbn are made in the photosensitive circuit semiconductor region PHOT and directly coupled to the critical node NC1-NCn of each photosensitive element PD1, PD2.

Consequently, the critical nodes NC1, NC2 of the photosensitive circuit semiconductor region PHOT are "fortified" by local circuits LCL1-LC2 (FIG. 2) providing a high impedance on the signals VD1-VD2, SS exchanged by the photosensitive element PD1-PDn with the outside (that is to say the amplification circuit EAmp, and possibly the analog-to-digital converter).

Thus, the amplification circuit EAmp (and also in particular the analog-to-digital converter) can be produced at a distance DST from the photosensitive circuit semiconductor region PHOT, in the peripheral circuit semiconductor region PRPH, without losing quality or sensitivity of the measured signal.

Consequently, the same amplification circuit EAmp can be pooled for a plurality of different photosensitive elements of the same group, thus offering a limited space requirement to a single amplification/conversion stage per group of several photosensitive elements, and also great architectural freedom to spatially organize the different photosensitive elements in the photosensitive circuit region.

Moreover, the amplification circuit EAmp can be produced in a conventional manner using, for example, an assembly of the "folded cascode" type.

Briefly, this type of amplifier typically includes two differential branches, each receiving the current flowing on the positive and negative inputs of the amplifier. The current injected on the positive input is imposed in the branch coupled to the negative input, by a typical current mirror assembly. The difference between the current copied into the negative input branch and the current injected on the negative input is copied into an output branch, again by a current mirror assembly. The difference between the current copied into the output branch and a reference current results in the output voltage.

The preamplifiers A1, A2 of the example of FIG. 2 can each comprise in this regard two differential branches coupled at their positive and negative inputs, the respective differential branches of the two preamplifiers being connected in parallel, forming a pair of parallel negative branches and a pair of parallel positive branches. Thus, the adder circuit ADD described in relation to FIG. 2 can correspond in this case to the addition of the currents by the Kirchhoff's law of nodes in the common node of a pair of parallel branches. The current mirror assembly copies the current flowing on the pair of parallel positive branches into the pair of parallel negative branches, and the current difference flowing on the pair of parallel negative branches is copied into the output branch to generate the output signal.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A photosensitive device, comprising:
a peripheral circuit semiconductor region;
a photosensitive circuit semiconductor region comprising a group of at least two photosensitive elements, each photosensitive element configured to generate a photoelectric signal on a respective critical node of a corresponding photosensitive element; and
an integrator circuit per group of photosensitive elements, each integrator circuit comprising:
an amplification circuit located in the peripheral circuit semiconductor region, the amplification circuit comprising input nodes and an output node, the amplification circuit configured to generate an output signal on the output node that is representative of sum of differential signals of a corresponding group,
a differential circuit for each photosensitive element of the group, the differential circuit located in the photosensitive circuit semiconductor region, the differential circuit coupled between a respective critical node and the input nodes of the amplification circuit, the differential circuit configured to generate a differential signal representative of the photoelectric signal generated on the respective critical node of the corresponding photosensitive element, and
a feedback circuit for each photosensitive element of the group, the feedback circuit comprising a capacitive element located in the photosensitive circuit semiconductor region, the feedback circuit coupled between the output node of the amplification circuit and the respective critical node.

2. The photosensitive device of claim 1, wherein each differential circuit includes a differential pair of transistors, a corresponding conduction terminal of the differential pair of transistors coupled in parallel between a supply current source and differential channels, and a corresponding control terminal of the differential pair coupled to a reference voltage terminal and to the respective critical node.

3. The photosensitive device of claim 1, wherein photosensitive elements of each group are spatially distributed in the photosensitive circuit semiconductor region so as to be distributed in a substantially homogeneous manner in an area occupied by the photosensitive elements.

4. The photosensitive device of claim 3, wherein spatially distributed is defined by a central symmetry on a point of symmetry located substantially at a center of the area occupied by photosensitive elements.

5. The photosensitive device of claim 3, wherein photosensitive elements are spatially distributed such that for a number N of photosensitive elements per group, one photosensitive element of each group is present in each subdivision into N equal surfaces of the area occupied by the photosensitive elements, where N is an integer.

6. The photosensitive device of claim 1, wherein the peripheral circuit semiconductor region comprises, for each amplification circuit, an analog-to-digital converter configured to convert a corresponding output signal into a digital signal.

7. An ambient light sensor comprising a photosensitive device, the photosensitive device comprising:
a peripheral circuit semiconductor region;
a photosensitive circuit semiconductor region comprising
a group of at least two photosensitive elements used to measure a respective optical component of ambient light, each photosensitive element configured to generate a photoelectric signal on a respective critical node of a corresponding photosensitive element; and
an integrator circuit per group of photosensitive elements, each integrator circuit comprising:
an amplification circuit located in the peripheral circuit semiconductor region, the amplification circuit comprising input nodes and an output node,
a differential circuit for each photosensitive element of the group, the differential circuit located in the photosensitive circuit semiconductor region, the differential circuit coupled between a respective critical node and the input nodes of the amplification circuit, each differential circuit having a differential pair of transistors, a corresponding conduction terminal of the differential pair of transistors is coupled in parallel between a supply current source and differential channels, and a corresponding control terminal of the differential pair is coupled to a reference voltage terminal and to the respective critical node, and
a feedback circuit for each photosensitive element of the group, the feedback circuit comprising a capacitive element located in the photosensitive circuit semiconductor region, the feedback circuit coupled between the output node of the amplification circuit and the respective critical node.

8. The ambient light sensor of claim 7, wherein the differential circuit is configured to generate a differential signal representative of the photoelectric signal generated on the respective critical node of the corresponding photosensitive element.

9. The ambient light sensor of claim 8, wherein the amplification circuit is configured to generate on the output node an output signal representative of a sum of differential signals of a corresponding group.

10. The ambient light sensor of claim 7, wherein photosensitive elements of each group are spatially distributed in the photosensitive circuit semiconductor region so as to be distributed in a substantially homogeneous manner in an area occupied by the photosensitive elements.

11. The ambient light sensor of claim 10, wherein spatially distributed is defined by a central symmetry on a point of symmetry located substantially at a center of the area occupied by photosensitive elements.

12. The ambient light sensor of claim 7, wherein photosensitive elements are spatially distributed such that for a number N of photosensitive elements per group, one photosensitive element of each group is present in each subdivision into N equal surfaces of an area occupied by the photosensitive elements, where N is an integer.

13. The ambient light sensor of claim 7, wherein the peripheral circuit semiconductor region comprises, for each amplification circuit, an analog-to-digital converter configured to convert an output signal into a digital signal.

14. A photosensitive device, comprising:
a photosensitive circuit semiconductor region comprising a set of photosensitive elements used to measure a respective optical component of ambient light, each photosensitive element configured to generate a photoelectric signal on a critical node of a corresponding photosensitive element;
an amplification circuit having a plurality of input nodes and an output node;
a differential circuit coupled between the critical node and the input nodes of the amplification circuit, wherein each differential circuit includes a differential pair of transistors, a corresponding conduction terminal of the differential pair of transistors coupled in parallel between a supply current source and differential channels, and a corresponding control terminal of the differential pair coupled to a reference voltage terminal and to the critical node; and
a feedback circuit comprising a capacitive element, the feedback circuit coupled between the output node of the amplification circuit and the critical node.

15. The photosensitive device of claim 14, wherein the differential circuit is configured to generate a differential signal representative of the photoelectric signal generated on the critical node.

16. The photosensitive device of claim 15, wherein the amplification circuit is configured to generate an output signal representative of sum of differential signals on the output node.

17. The photosensitive device of claim 14, wherein the set of photosensitive elements are spatially distributed in the photosensitive circuit semiconductor region so as to be distributed in a substantially homogeneous manner.

18. The photosensitive device of claim 17, wherein the set of photosensitive elements are spatially distributed such that for a number N of photosensitive elements, one photosensitive element is present in each subdivision into N equal surfaces of an area occupied by the photosensitive elements, where N is an integer.

19. The photosensitive device of claim 17, wherein spatially distributed is defined by a central symmetry on a point of symmetry located substantially at a center of an area occupied by photosensitive elements.

20. The photosensitive device of claim 14, wherein the set of photosensitive elements are spatially distributed in the photosensitive circuit semiconductor region in a substantially homogeneous manner in an area occupied by the photosensitive elements.

* * * * *